United States Patent [19]
Taylor et al.

[11] Patent Number: 6,075,285
[45] Date of Patent: Jun. 13, 2000

[54] SEMICONDUCTOR PACKAGE SUBSTRATE WITH POWER DIE

[75] Inventors: Gregory F. Taylor; George L. Geannopoulos, both of Portland, Oreg.; Larry E. Mosley, Sunnyvale, Calif.

[73] Assignee: Intel Corporation, Santa Clara, Calif.

[21] Appl. No.: 08/990,705

[22] Filed: Dec. 15, 1997

[51] Int. Cl.$^7$ .................................................. H01L 23/52
[52] U.S. Cl. .............................................. 257/691; 257/700
[58] Field of Search ........................................ 257/691, 700

[56] References Cited

U.S. PATENT DOCUMENTS

| | | | |
|---|---|---|---|
| 5,165,055 | 11/1992 | Metsler | 333/12 |
| 5,237,204 | 8/1993 | Val | 257/698 |
| 5,789,807 | 8/1998 | Correale, Jr. | 257/691 |

*Primary Examiner*—Carl Whitehead, Jr.
*Assistant Examiner*—Roy Potter

*Attorney, Agent, or Firm*—Blakely, Sokoloff, Taylor & Zafman LLP

[57] ABSTRACT

An apparatus that efficiently delivers electrical power and lowers the inductance to an integrated circuit. In one embodiment, the present invention includes an apparatus for delivering electrical power to an integrated circuit comprising two planes, substantially parallel to one another, having many ground and power traces. The ground and power traces of the separate planes are connected together and connected to the integrated circuit, thereby providing power to the integrated circuit. In each individual plane, the ground and power traces are substantially parallel to each other, one array of traces in one plane substantially perpendicular to another array of traces in another plane. The apparatus being electrically coupled to a printed circuit board having at least one decoupling capacitor with first and second electrodes coupled to at least two of the ground and power connections, respectively, of the integrated circuit through the printed circuit board, and the first and second ground and power planes.

8 Claims, 6 Drawing Sheets

SEMICONDUCTOR PACKAGE SUBSTRATE WITH POWER DIE

BACKGROUND OF THE INVENTION

1. Field of the Invention

The present invention relates generally to semiconductor packaging and, more specifically, to lowering the inductance in integrated circuit packages.

2. Description of Related Art

It is generally desirable to have a semiconductor package which is more efficient and has high decoupling capacitance/low inductance. It is known that the effective inductance can be lowered by connecting decoupling capacitors to a circuit. Inductance is a function of path length, therefore the longer the current path, the higher the inductance. High inductance, which yields higher supply noise in semiconductor packages, reduces the performance of integrated circuits (ICs). Also, inductance between an IC and power supply can induce spurious voltage spikes in the power supply system, which can in turn cause timing problems in signal switching.

Decoupling capacitors are housed on semiconductor packages, in order to lower the inductance through the package. Decoupling capacitors shunt power and ground planes or power and ground leads so that rapid voltage changes in the device result in an electrical short circuit across the capacitor, compensating voltage spikes with a stored charge on the decoupling capacitor. The stored charge either dissipates or is used as a local power supply to device inputs during signal switching stages, allowing the decoupling capacitor to negate the effects of voltage noise induced into the system by parasitic inductance.

One way decoupling capacitors have been used in the past is shown in FIG. 1. As shown, a semiconductor package substrate 100 that houses an IC 111 is attached to a printed circuit board 119. The IC 111 is coupled to a semiconductor package substrate 100 by a plurality of solder connections 115, and in turn the semiconductor package substrate 100 is coupled to printed circuit board 119 by a plurality of solder connections 114. A decoupling capacitor 112 is electrically coupled by a plurality of solder connections 116 to power connections 105 and ground connections 106 of an IC 111 through a power plane 120 and a ground plane 121. The current path 113 from the IC 111 to the decoupling capacitor 112 travels through the power plane 120 and ground plane 121 of semiconductor package substrate 100 in the manner illustrated in FIG. 1. Problems arise in this prior art package, because the current path 113 that is parallel to the IC 111, between the IC 111 and the decoupling capacitor 112, is long and creates high inductance. Therefore, it is desirable to reduce the parallel current flow in order to keep inductance at a minimum.

Another problem with the prior art, which leads to higher inductance, is the existence of separate power and ground planes. The separation distance between the planes 120 and 121 contributes to the inductance problem by extending the current path 113 between the IC and the decoupling capacitor. Another problem associated with this arrangement of separate ground and power planes is an increased inductance due to each current flowing through each connection, without a current opposing the same. Although decoupling capacitors are necessary, if a better power supply and return arrangement to and from an IC is obtained, it would be possible to reduce inductance and have higher performance ICs.

Since semiconductor packages are small and have space constraints, capacitors that are placed on a semiconductor package must also be small. Smaller capacitors are costly. In addition, the space constraints associated with present day semiconductor packages make it difficult to rotate capacitors, which is important in order to reduce Electro Magnetic Interference(EMI). EMI is unwanted electronic noise produced by high frequency electronic circuits which can induce malfunctions in electronic equipment. This EMI would effect the performance of other chips and nearby systems.

It would therefore be desirable to provide a semiconductor package which provides for a reduction of the inductance and better power supply delivery to an IC.

SUMMARY OF THE INVENTION

An apparatus that delivers electrical power and lowers the inductance to an IC is disclosed. In accordance with one embodiment of the present invention, power is delivered to an integrated circuit through a substrate containing a plurality of ground and power traces. A first plurality of ground and power traces are provided in a first plane of the substrate, the ground and power traces being arranged in a substantially parallel configuration. A second plurality of ground and power traces is also provided within a second plane of the substrate with the ground and power traces also being arranged in a substantially parallel configuration to one another. At least two power and ground traces in each plane electrically are coupled to at least two power and ground traces in an adjoining plane.

BRIEF DESCRIPTION OF DRAWINGS

The present invention is illustrated by way of example and is not limited by the figures of the accompanying drawings, in which like references indicate similar elements, and in which.

DETAILED DESCRIPTION OF THE INVENTION

An apparatus for delivering electrical power and reducing inductance to an integrated circuit(IC) is described. In the following description, numerous specific details are set forth in order to provide a thorough understanding of the invention. However, it will be appreciated by one skilled in the art that the invention may be practiced without these specific details. In other instances, well-known elements have not been shown nor described in order to avoid unnecessarily obscuring the invention.

Figure 1:
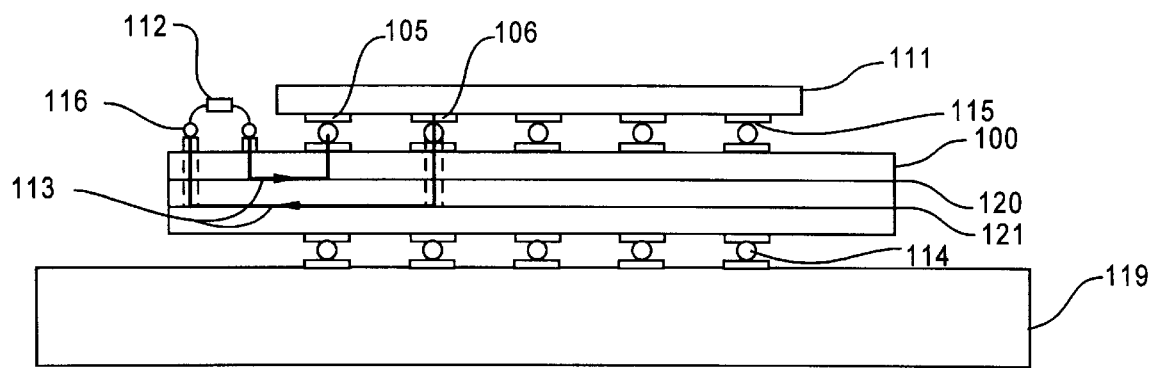
FIG. 1 illustrates a prior art semiconductor package substrate.
Figure 2:
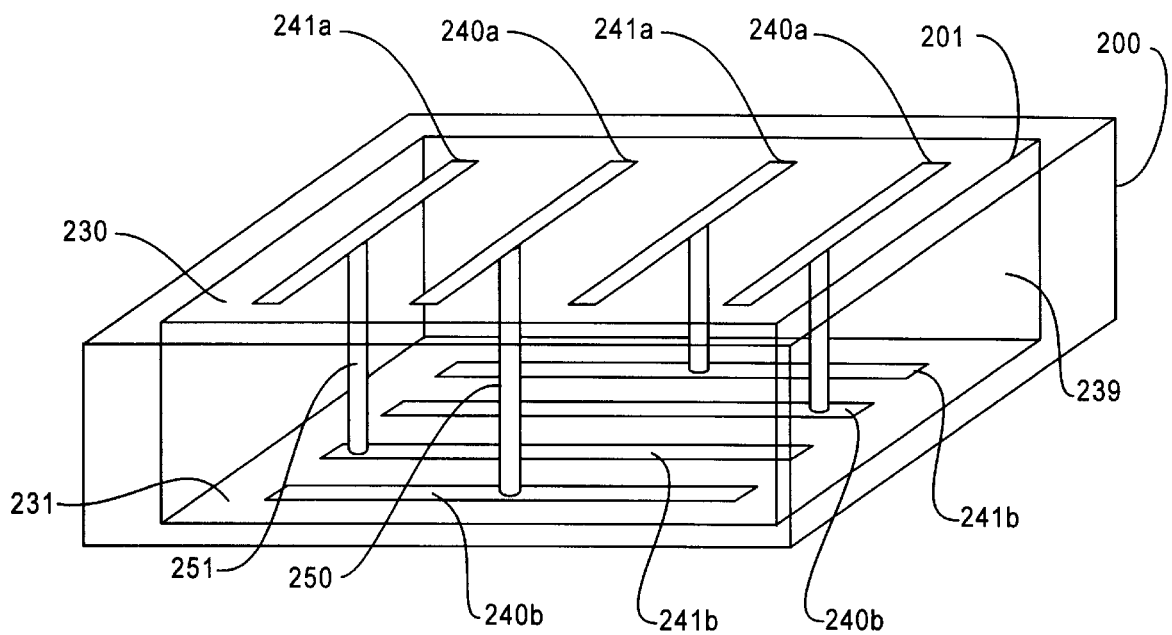
FIG. 2 illustrates the power supply network in a semiconductor package substrate of the present invention.

FIG. 2 illustrates a transparent perspective view of a semiconductor package 200 having a power supply network 201 in one embodiment of the present invention. The power supply network 201 of semiconductor package 200 contains a first set of power traces 240a and ground traces 241a that are arranged substantially parallel to one another. Power and ground traces 240a and 241a are located in a first plane 230 of network 201. A second set of power traces 240b and ground traces 241b are provided in a second plane 231. Power and ground traces 240b and 241b are arranged substantially parallel to one another. First plane 230 and second plane 231 comprise conductive layers within semiconductor package 200. As illustrated, second plane 231 is arranged substantially parallel to first plane 230. Planes 230 and 231 are separated by a nonconductive layer 239. In one embodiment, the second set of power traces 240b and ground traces 241b are arranged substantially perpendicular to the first set of power traces 240a and ground traces 241a. The second set of ground traces 241b and power traces 240b are typically connected to the first set of ground traces 241a and power traces 240a by through vias 251 and 250, respectively, within the nonconductive layer 239. In accordance with one embodiment of the invention, ground traces 241b and power traces 240b are electrically coupled to ground and power connections on a printed circuit board (not shown), whereas ground traces 241a and power traces 240a are electrically coupled to an integrated circuit (not shown) that is housed on the semiconductor package 200.

This arrangement has advantages over the prior art. By arranging ground traces 241a and power traces 240a in the same plane, opposing currents of approximately equal magnitude are created. The mutual inductance of the opposing currents in these traces cancels most of the self inductance of these currents. As a result, less inductance is translated to the integrated circuit. This lowering of the inductance allows the integrated circuit to function more efficiently. The arrangement of ground traces 241b and power traces 240b has the same advantages as the ground traces 241a and power traces 240a. The substantially perpendicular arrangement allows for the currents to travel across the substrate 201 to areas where less current is flowing. This alleviates "hot spots", areas of high concentration of current.

Figure 3:
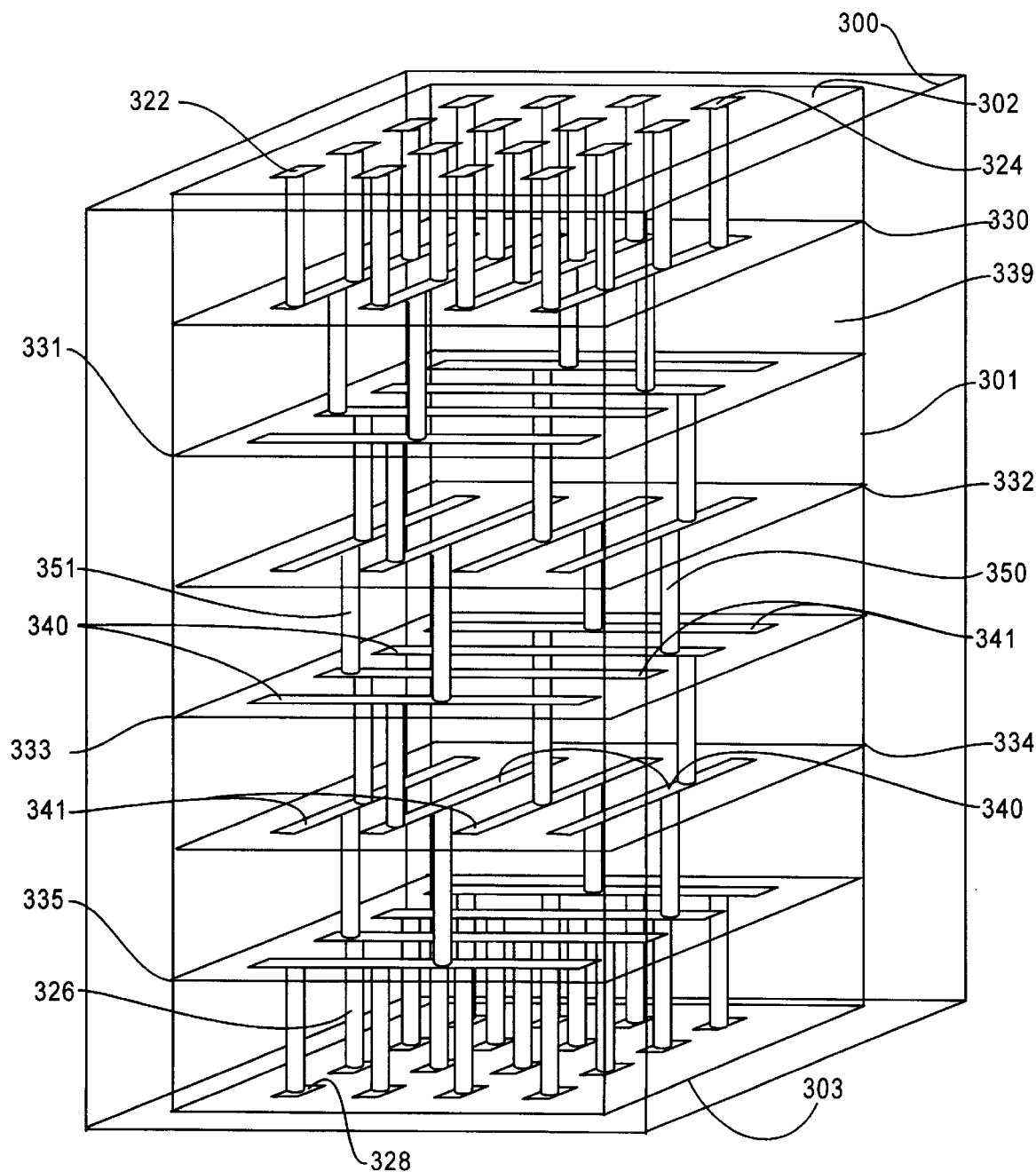
FIG. 3 illustrates the power supply network in a semiconductor package substrate in one embodiment of the present invention.

Turning now to FIG. 3, a transparent, perspective view of a semiconductor package 300 in one embodiment of the present invention is shown. Package 300 includes a power supply network 301 that comprises a plurality of ground/power planes 330 through 335. Planes 330 through 335 are separated by nonconductive layers 339. Each of the ground/power planes includes a set of power traces 340 and ground traces 341. The power and ground traces in each plane are electrically coupled to the power and ground traces of neighboring planes by conductive vias 350 and 351, respectively. A top surface 302 of package 300 includes a set of electrically conductive bond pads 322 and 324 that are electrically coupled to the ground traces 341 and the power traces 340 of the top most ground/power plane 330, respectively. Lands 322 and 324 are used to electrically couple package 300 to an integrated circuit, such as, a microprocessor(not shown). Package lands for surface mount 326 and 328 are provided along the bottom surface 303 of package 300 and are electrically coupled to the ground traces 341 and power traces 340 of the bottom most ground/power plane 335, respectively. Package lands 326 and 328 are generally coupled to a corresponding set of board lands on a printed circuit board(not shown), or the like. The electrical interconnection between the package lands and the pads and lands of the integrated circuit and printed circuit board is typically made through a plurality of solder connections.

Current flow is provided through the lands 328 on the bottom surface 303 of package 300, up vias 350, through planes 335, 334, 333, 332, 331 and 330, through lands 324 on the top surface 302 of the semiconductor package 300. Current flow through the ground path is reversed in that the current travels from the lands 322 on the top surface 302 of semiconductor package 300, and travels through vias 351 through planes 330, 331, 332, 333, 334 and 335 to lands 326 on the bottom surface 303 of package 300.

The vertical current flows through vias 350 and 351, and creates a phenomenon known as mutual inductance. The magnetic fields created by these currents which are approximately equal in magnitude and opposite in direction cancel each other, and therefore the inductance which is created cancels each other. This reduction and almost complete cancellation of the inductance created by these currents in this arrangement of planes of ground and power traces is an advantage of the present invention.

Figure 4:
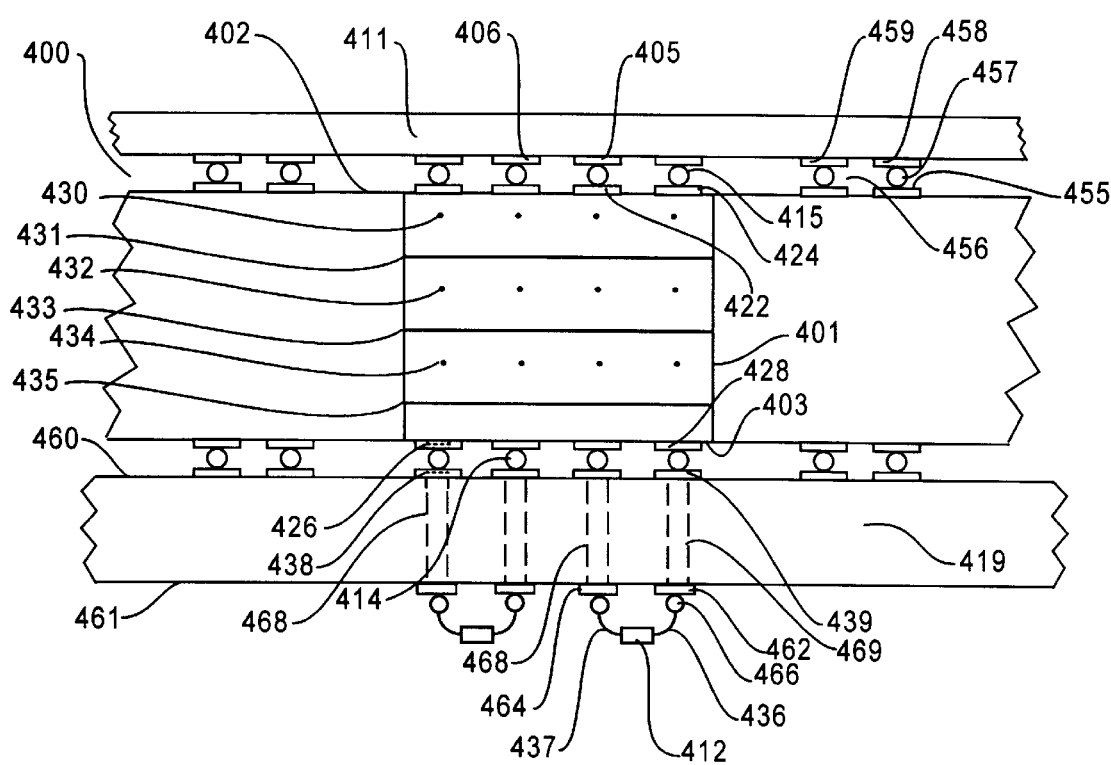
FIG. 4 illustrates one embodiment of the present invention.

FIG. 4 illustrates a side view of one embodiment of the present invention. A semiconductor package 400 with a power supply network 401 is shown. The top surface 402 of package 400 contains a set of package lands 422 and 424, which are electrically connected to a corresponding set of electrical contact pads 405 and 406 of an integrated circuit 411. These connections are generally made by a plurality of solder interconnections 415. The bottom surface 403 of the semiconductor package 400 also has a set of lands 426 and 428 that are electrically connected to a corresponding set of lands 438 and 439, located on the top surface 460 of a printed circuit board 419. These connections are also generally made by a plurality of solder interconnections 414. The bottom surface 461 of printed circuit board 419 contains a set of lands 462 and 464. At least one decoupling capacitor 412, having a first electrode 436 and a second electrode 437 is connected to lands 462 and 464 by solder interconnections 466. The current through the first electrode 436 of decoupling capacitor 412 travels through via 469 of printed circuit board 419, through solder connection 428. The current flow continues through the ground/power planes 430 through 435 to lands 424. The current is ultimately delivered to IC 411 through solder 415 and pad 405. The ground current flows down through pads 406 and lands 422, through ground/power planes 430 through 435. This current flow continues through lands 426 and 438, through via 468 of printed circuit board 419, through lands 464 and to the second electrode 437 of the decoupling capacitor 412. Input/Output (I/O) pads 455 exists on the periphery of IC 411 and are connected to the printed circuit board 419 through lands 458a, 458b, and 459 on semiconductor package 400 and printed circuit board 419. The IC and printed circuit board are coupled to package 400 by a plurality of solder interconnections 457a and 457b, respectively. The I/O currents can be routed through semiconductor package 400 in a similar manner as the power and ground currents, or may be routed using conventional methods.

The inductive loop of the present invention is smaller than the inductive loops created in the prior art. Lower inductance results in a higher performance integrated circuit 411. Also, since the capacitors 412 are coupled to the bottom surface of printed circuit board 419, larger and less expensive capacitors may be used. The reasoning being that there are less space constraints on a printed circuit board 419 than there are on a semiconductor package 400.

Figure 5:
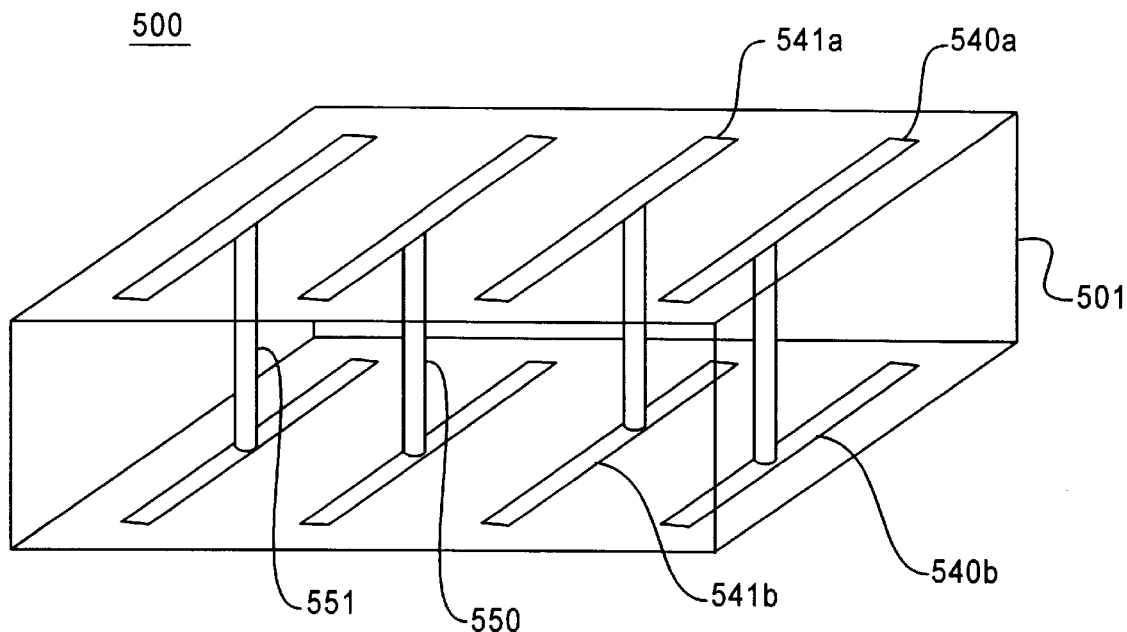
FIG. 5 illustrates another embodiment of the power supply network of the present invention.
Figure 6:
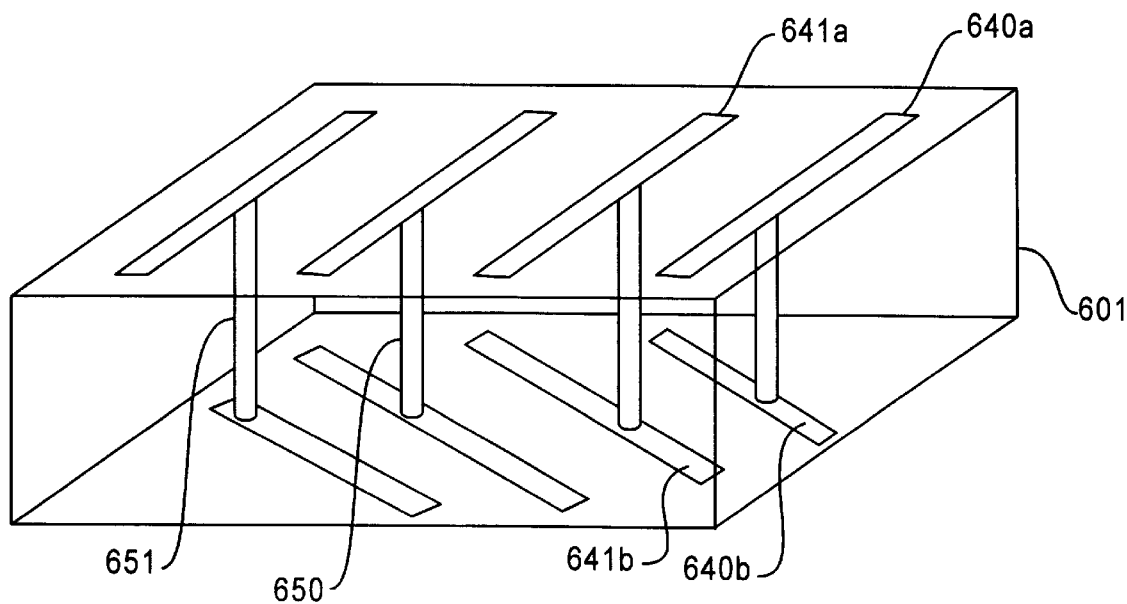
FIG. 6 illustrates another embodiment of the power supply network of the present invention.

Turning now to FIG. 5, another embodiment of a power supply network of the present invention is shown. As illustrated in FIG. 5, power supply network 500 includes a first set of power traces 540a and ground traces 541a and a second set of power traces 540b and ground traces 541b that are separated by a nonconductive layer 501. The first set of power and ground traces are arranged substantially parallel to one another. Power traces 540a and 540b are electrically coupled by through via 550. Ground traces 541a and 541b are electrically coupled by through via 551. FIG. 6 depicts another embodiment of the present invention wherein the power supply network 600 has a first set of power traces 640a and ground traces 641b and a second set of power traces 640b and ground traces 641b that are disposed in substantially parallel planes and connected by through vias 650 and 651. The first and second set of traces are separated by a nonconductive layer 601. In accordance with the embodiment of FIG. 6, the first set of power and ground traces is offset from the second set of power and ground traces by an angle. In one embodiment, the first set of power and ground traces is offset from the second set of power and ground traces at approximately forty-five degrees. This results in a changed pitch that simplifies the connection of standard sized capacitors.

Figure 7:
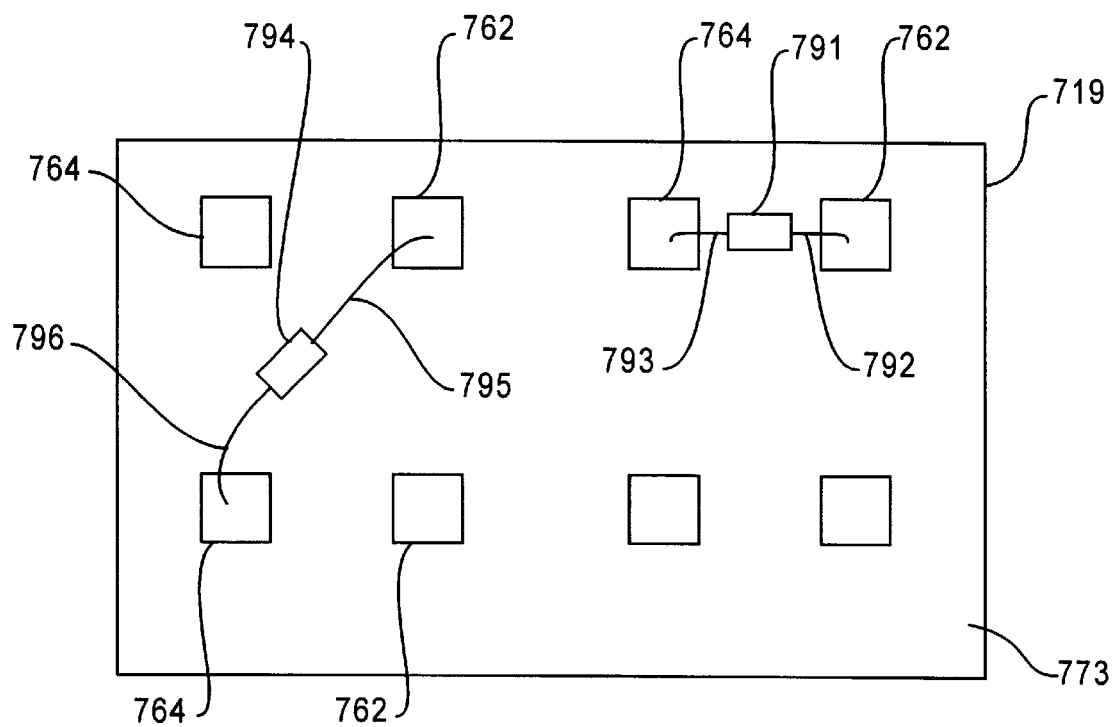
FIG. 7 illustrates another embodiment of the present invention wherein decoupling capacitors located along a bottom surface of a printed circuit board are rotated in relation to one another.

As discussed above, decoupling capacitors may be attached to the bottom side of a printed circuit board and coupled to an integrated circuit in the manner illustrated in FIG. 4. FIG. 7 shows a bottom view of a printed circuit board 719 in another embodiment of the present invention. Decoupling capacitors 791 and 794 are connected to the bottom surface 773 of printed circuit board 719. Capacitor 791 is coupled to contact lands 762 and 764 by electrodes 792 and 793. Capacitor 794 is attached to another set of lands 762 and 764 by electrodes 795 and 796. In accordance with one embodiment of the present invention, capacitors 791 and 794 are positioned at angles to one another so that the electrodes 792 and 793 of capacitor 791 are not oriented in the same direction as electrodes 795 and 796 of capacitor 794. The rotation or angular orientation of the electrodes of capacitor 794 with that of the electrodes of capacitor 791 reduces EMI which would otherwise be produced if the electrodes of the capacitors were oriented in the same direction. Rotating capacitor 794 in relation to capacitor 791 solves the problems created by EMI because, although EMI adds when the electrodes 793 and 792 of capacitor 791 are oriented in the same direction, it partially cancels when the electrodes 795 and 796 of capacitor 794 are at angles to one another. The placement of the decoupling capacitors along the bottom surface 773 of printed circuit board 719, as opposed to the package substrate, alleviates the space constraints associated with the prior art apparatus. Because capacitors 791 and 794 are mounted to the bottom surface 773 of printed circuit board 719, more room is available for rotating capacitors 791 and 794, as compared to the prior art devices. Moreover, the present invention permits larger and less expensive capacitors to be used.

Whereas many alterations and modifications of the invention will no doubt be appreciated by one of ordinary skill in the art after having read the foregoing description, it is understood that the particular embodiments shown and described by way of illustration are in no way intended to be considered limiting. Therefore, references to details of the individual embodiments are not intended to limit the scope of the claims which in themselves recite only those features regarded as essential to the invention.

We claim:

1. An assembly comprising:
   an integrated circuit (411) having a plurality of electrical contact pads (405) through which power can be supplied thereto and by which it can be grounded;
   a package substrate (400) having a first surface with a plurality of electrical bond pads (424), each of which is electrically connected to a respective one of the electrical contact pads, and an opposing surface having a plurality of lands (426), each of which is for connecting to a respective land (438) of a printed circuit board (419), the package substrate including:
   at least first, second and third nonconductive layers (339);
   a first plurality of traces located in a first plane (330) between the first and second nonconductive layers and substantially parallel to one another, including a first power trace (240a) connected to one of the electrical bond pads to supply power to one of the electrical contact pads, a second power trace (240a) connected to one of the electrical bond pads to supply power to one of the electrical contact pads, a first ground trace (241a) connected to one of the electrical bond pads to ground one of the electrical contact pads, and a second ground trace (241a) connected to one of the electrical bond pads to ground one of the electrical contact pads; and
   a second plurality of traces located in a second plane (331), parallel to the first plane, between the second and third nonconductive layers and substantially parallel to one another, including a third power trace (240b) connected to the first power trace, a fourth power trace (240b) connected to the second power trace, a third ground trace (241b) connected to the first ground trace, and a fourth ground trace (241b) connected to the second ground trace, the third and fourth power traces and the third and fourth ground traces each being connected to a respective one of the lands on the package substrate wherein the first plurality of traces extend in a first direction and the second plurality of traces extend in a second direction transverse to the first direction.

2. The assembly of claim 1 wherein current in the power traces (240a) in the first plane (330) and current in the ground traces (241a) in the first plane (330) flow in opposite directions.

3. The assembly of claim 2 wherein current in the power traces (240b) in the second plane (331) and current in the ground traces (241b) in the second plane (331) flow in opposite directions.

4. The assembly of claim 3 wherein the package substrate includes:
   a fourth nonconductive layer (339); and
   a third plurality of traces located in a third plane (332), parallel to the first and second planes (330, 331), between the third and fourth nonconductive layers and substantially parallel to one another, including a fifth power trace connected to the third power trace, a sixth power trace connected to the fourth power trace, a fifth ground trade connected to the third ground trace and a sixth ground trace connected to the fourth ground trace, the third plurality of traces extending in the first direction and current flowing in the power traces thereof in a direction opposite to current flowing in the ground traces thereof.

5. The assembly of claim 1 comprising a first decoupling capacitor having one terminal electrically connected to the first and second power traces and another terminal electrically connected to the first and second ground traces.

6. The assembly of claim 5 comprising a printed circuit board (419) having a plurality of lands (438), each connected to a respective land (426) of the package substrate and a plurality connections (469) on an opposing side thereof, the decoupling capacitor being secured to the connections (469) and electrically connected through the connections (469) to the first and second power and ground traces.

7. The assembly of claim 6 comprising a second decoupling capacitor which is located at a nonparallel position to the first decoupling capacitor.

8. An assembly comprising:

an integrated circuit (411) having a plurality of electrical contact pads (405) through which power can be supplied thereto and by which it can be grounded;

a package substrate (400) having a first surface with a plurality of electrical bond pads (424) each of which is electrically connected to a respective one of the electrical contact pads, and an opposing surface having a plurality of lands (426) each of which is for connecting to respective land (438) of a printed circuit board (419), the package substrate including:

a first plurality of traces located in a first plane (330) between the first and second nonconductive layers and substantially parallel to one another, including a first power trace (240*a*) connected to one of the electrical bond pads to supply power to one of the electrical contact pads, a second power trace (240*a*) connected to one of the electrical contact pads, a first ground trace (241*a*) connected to one of the electrical bond pads to ground one of the electrical contact pads, and a second ground trace (241*a*) connected to the one of the electrical bond pads to ground one of the electrical contact pads, wherein current flows in the first and second power traces in a direction opposite to a direction in which current flows in the first and second ground traces; and a second plurality of traces located in a second plane (331), parallel to the first plane, between the second and third nonconductive layers and substantially parallel to one another, including a third power trace (240*b*) connected to the first power trace, a fourth power trace (240*b*) connected to the second power trace, a third ground trace (241*b*) connected to the first ground trace (241*b*), and a fourth ground trace (241*b*) connected to the second ground trace, wherein current flows in the third and fourth power traces in a direction opposite to a direction in which current flows in the third and fourth ground traces, the third and fourth power traces and the third and fourth ground traces each being connected to a respective one of the lands on the package substrate.

\* \* \* \* \*